(12) United States Patent
Bouchez et al.

(10) Patent No.: US 10,454,467 B2
(45) Date of Patent: Oct. 22, 2019

(54) CONTROL DEVICE FOR TRANSISTORS

(71) Applicant: VALEO SIEMENS EAUTOMOTIVE FRANCE SAS, Cergy (FR)

(72) Inventors: Boris Bouchez, Cergy (FR); Mathieu Grenier, Houilles (FR); José-Louis Da Costa, Franconville (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 0 days.

(21) Appl. No.: 15/772,006

(22) PCT Filed: Oct. 25, 2016

(86) PCT No.: PCT/EP2016/075666
§ 371 (c)(1),
(2) Date: Apr. 27, 2018

(87) PCT Pub. No.: WO2017/072113
PCT Pub. Date: May 4, 2017

(65) Prior Publication Data
US 2018/0316341 A1    Nov. 1, 2018

(30) Foreign Application Priority Data
Oct. 28, 2015  (FR) ..................................... 15 60330

(51) Int. Cl.
*H03K 17/082*    (2006.01)
*H03K 17/16*    (2006.01)
(Continued)

(52) U.S. Cl.
CPC ........ *H03K 17/0828* (2013.01); *H02M 1/088* (2013.01); *H03K 17/0822* (2013.01); *H03K 17/168* (2013.01); *H02M 1/38* (2013.01)

(58) Field of Classification Search
CPC ........... H03K 17/0828; H03K 17/0822; H03K 17/168; H02M 1/088; H02M 1/38
(Continued)

(56) References Cited

U.S. PATENT DOCUMENTS

2014/0375362 A1*  12/2014  Lobsiger ................ H03K 17/00
                                                                   327/109
2015/0180462 A1*   6/2015  Bouchez ............ H03K 17/0828
                                                                   327/109

FOREIGN PATENT DOCUMENTS

EP        2816728 A1    12/2014
WO    2014009668 A1     1/2014

OTHER PUBLICATIONS

Written Opinion and International Search Report of PCT/EP2016/075666.
Preliminary Report of Application No. FR 1560330.

* cited by examiner

Primary Examiner — Tomi Skibinski
(74) Attorney, Agent, or Firm — Joseph G. Chu; JCIP

(57) ABSTRACT

The present invention relates to a control device (1) for at least one transistor, referred to as the controlled transistor (3), comprising:—said controlled transistor (3) which comprises a control electrode ($E_c$) and two other electrodes ($E_1$ and $E_2$),—a main control circuit (5) connected to the control electrode ($E_c$) of the controlled transistor (3) and configured, according to a main mode of operation, to control the state of the controlled transistor (3) and,—an auxiliary control circuit (11) configured, according to an auxiliary mode of operation, to inject an auxiliary current opposing the current circulating between the main control circuit (5) and the control electrode ($E_c$) of the controlled transistor (3), characterized in that the control device (1) also comprises a control circuit (15) of the auxiliary control circuit (11), said (Continued)

control circuit (15) being configured to block or authorize the auxiliary operation of the auxiliary control circuit (11) depending on the commands from the main control circuit (5).

18 Claims, 3 Drawing Sheets

(51) Int. Cl.
*H02M 1/088* (2006.01)
*H02M 1/38* (2007.01)

(58) Field of Classification Search
USPC .... 327/108–112, 427, 434, 437; 326/82, 83, 326/87
See application file for complete search history.

CONTROL DEVICE FOR TRANSISTORS

The present invention relates to the field of control devices for transistors, in particular power transistors used in motor vehicles, for example, at the level of converters.

Transistors are indeed commonly used in converters, like for example, inverters. The control devices of these transistors are configured to inject or not a current at the level of the control electrode of the transistor to make it loop or to make it block.

However, during the blocking of the transistor, a surge can appear between the electrodes other than the control electrode, which can damage the transistor.

To avoid these surges, there are different solutions in the state of the art, but these solutions generally have a disadvantage, like an increased cost or a too-slow reaction or significant induced electrical losses.

So as to overcome these disadvantages, an auxiliary device aiming to limit the surge and to reduce losses by switching is defined in document FR2993422 wherein the voltage at the terminals of an impedance connected to one of the electrodes other than the control electrode is detected. However, in the case of a converter comprising an arm or half-bridge supplied by a voltage generator E wherein are connected in series two switches K1 and K2, connected in series, as represented in FIG. 1, a switch K1, K2 comprising a transistor T1, T2 and a diode D1, D2, referred to as a freewheeling diode, connected in anti-parallel from the transistor T1, T2, this solution can create a short-circuit at the level of the arm (simultaneous closure of the two switches K1 and K2) and damage the electrical equipment connected to the converter, like an electric engine or a battery. Indeed, during the opening of the first transistor T1, a current can circulate in the freewheeling diode D1 connected to the first transistor T1, the diode D1 thus being looped. Then, when the diode D1 is blocked, there is thus a variation in current during a phase called the recovery phase. This variation in current creates a voltage at the level of the impedance connected to the first transistor T1, such that the auxiliary device connected to the first transistor T1 can make the first transistor T1 loop. Yet, if the second transistor T2 is looped in a loop mode during the recovery phase of the first diode D1, a short-circuit is created at the level of the arm. Therefore, a solution must be found enabling to control a transistor T1, T2 without damaging the latter and by preventing the short-circuiting of an arm comprising two transistors T1 and T2 connected in series.

To this end, the present invention aims for a control device of at least one transistor, referred to as a controlled transistor, comprising:
- said controlled transistor, the latter comprising a control electrode and two other electrodes,
- a main control circuit connected to the control electrode of the controlled transistor and configured to, according to main mode of operation, control the state of the controlled transistor and,
- an auxiliary control circuit configured to, according to an auxiliary mode of operation, inject an auxiliary current opposing the current circulating between the main control circuit and the control electrode of the controlled transistor,
- wherein the control device also comprises a control circuit of the auxiliary control circuit, said control circuit being configured to block or authorise the auxiliary operation of the auxiliary control circuit depending on controls of the main control circuit.

The main control circuit can therefore be configured to control the control circuit of the auxiliary control circuit to block the auxiliary operation of the auxiliary control circuit, in particular when the controlled transistor becomes blocking or to authorise the auxiliary operation of the auxiliary control circuit.

According to another aspect of the present invention, the control circuit is configured to electrically conduct the auxiliary control circuit and the control electrode of the controlled transistor to authorise the auxiliary mode of operation or to interrupt said electrical conduction and block the auxiliary mode of operation.

According to an additional aspect of the present invention, the control circuit comprises a first switching element configured to enable the electrical conduction between the auxiliary control circuit and the control electrode of the controlled transistor or to interrupt said electrical conduction.

According to an additional aspect of the present invention, the control circuit comprises a second switching element corresponding to a MOSFET-type transistor with a channel N of which:
- the gate is connected to the main control circuit and in particular to the control member of the main control circuit,
- the drain is connected, on the one hand, to a first voltage source and, on the other hand, to the control electrode of the first switching element and,
- the source is connected to a second voltage source of which the voltage is less than the voltage of the first voltage source.

According to another aspect of the present invention, the main control circuit comprises a programmable logic component configured to generate pulse-width modulation signals and a control member configured to receive pulse-width modulation signals coming from a logic component and to transform them into control signals of the controlled transistor.

According to an additional aspect of the present invention, the auxiliary control circuit is configured to operate according to an auxiliary mode of operation when a predefined condition relating to the value of the time drift of the current circulating between the electrodes of the controlled transistor other than the control electrode is verified.

According to an additional aspect of the present invention, the auxiliary control circuit is configured to enslave the value of the time drift of the current circulating between the electrodes of the transistor other than the control electrode around a set value.

According to another aspect of the present invention, wherein the auxiliary control circuit comprises a detection member and an injection member, said injection member being configured to inject an auxiliary current opposing the current circulating between the main control circuit and the control electrode of the controlled transistor when it receives a voltage coming from the detection member.

According to an additional aspect of the present invention, the detection member comprises a transistor, referred to as a detection transistor, connected to a current sensor measuring the current circulating in the controlled transistor between the electrodes other than the control electrode, the current sensor comprising an impedance and a voltage dividing bridge, comprising a first and a second resistor, connected in parallel from the impedance, the control electrode of the detection transistor is connected to the middle point of the voltage dividing bridge, the positive power electrode of the detection transistor is connected to an impedance terminal, in particular via an RC filter, and the negative power electrode of the detection transistor is connected to the injection member.

According to another aspect of the present invention, the auxiliary control circuit comprises a detection member and an injection member, said detection member being configured to transmit a voltage to the injection member when the time drift of the current circulating between the electrodes of the controlled transistor other than the control electrode exceeds a predetermined threshold, said injection member being configured to inject an auxiliary current opposing the current circulating between the main control circuit and the control electrode of the controlled transistor when it receives a voltage coming from the detection member.

According to an additional aspect of the present invention, the injection member comprises a transistor, referred to as an injection transistor of which the control electrode is connected to the detection member and to the first voltage source via a resistor, the positive power electrode of the injection transistor is connected to the first voltage source and the negative voltage electrode is connected to the positive control electrode of the first switching element of the control circuit.

According to another aspect of the present invention, the negative power electrode of the first switching element of the control circuit is connected to the control electrode of the controlled transistor.

According to an additional aspect of the present invention, the negative power electrode of the first switching element of the control circuit is connected to the input of a power amplifier arrangement, in particular of the "push-pull" type, arranged between the main control circuit and the control electrode of the controlled transistor, the auxiliary control circuit being arranged such that this power amplified arrangement is crossed by the injected current when the auxiliary mode of operation is applied.

According to an additional aspect of the present invention, the negative power electrode of the first switching element of the control circuit is connected to a resistor, referred to as a control resistor, arranged between the main control circuit and the control electrode of the controlled transistor, at the level of the terminal of the control resistor which is not connected to the control electrode of the controlled transistor.

The present invention also relates to a control circuit of a connection comprising at least one first and one second controlled element connected in series, a controlled element comprising a diode connected in anti-parallel with a controlled transistor, and at least one first and one second control device, according to one of the preceding claims, respectively connected to said first and second controlled elements, said first and second control devices being configured to put their respective connected controlled transistor in a looping state alternatively or into a blocking state simultaneously.

According to another aspect of the present invention, the first control device is configured to:
  block the auxiliary operation of the auxiliary control circuit connected to the first controlled transistor when the second control device controls a passage to the looping state of the second controlled transistor,
  authorise the auxiliary operation of the auxiliary control circuit connected to the first controlled transistor when said first control device controls a passage to the blocking state of the first controlled element,
and wherein the second control device is configured to:
  block the auxiliary operation of the auxiliary control circuit connected to the second controlled transistor when the first control device controls a passage to the looping state of the first controlled transistor,
  authorise the auxiliary operation of the auxiliary control circuit connected to the second controlled transistor when said second control device controls a passage to the blocking state of the second controlled transistor.

The present invention also relates to an electrical converter comprising at least one connection comprising a first and a second controlled element connected in series and at least one control circuit of the controlled elements.

Other characteristics and advantages of the invention will appear in the description which will now be made, in reference to the appended drawings which represent it, to give information but not limitative information, about the possible embodiments.

In these drawings.

In these figures, the same reference numbers mean elements having an identical function.

The following embodiments are examples. Although the description refers to one or more embodiments, this does not necessarily mean that each reference relates to the same embodiment, or that the characteristics apply only to one single embodiment. Simple characteristics of different embodiments can also be combined to provide other embodiments.

In the description which will follow, the terms below generally mean:

The term "IGBT" is the acronym of Insulated Gate Bipolar Transistor.

The term "MOSFET" is the acronym of Metal Oxide Semiconductor Field Effect Transistor.

Figure 1:
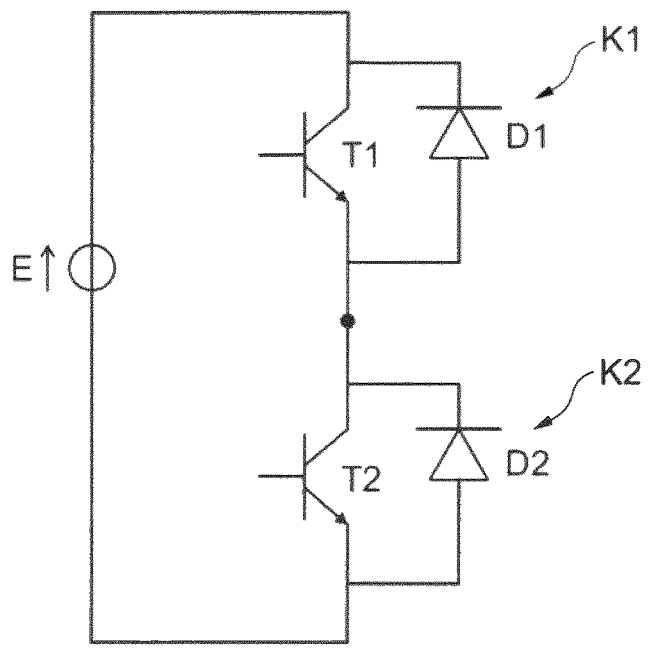
FIG. 1 represents a diagram of an arm of an inverter comprising two switches connected in series.
Figure 2:
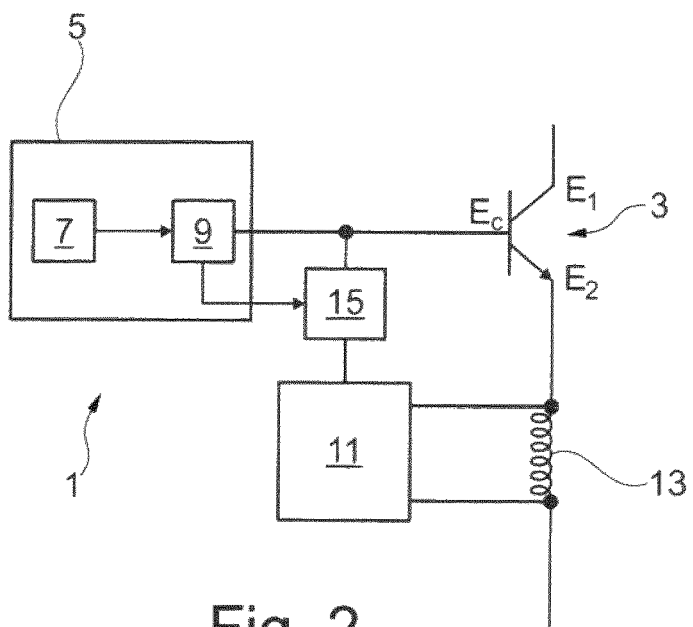
FIG. 2 represents a simplified diagram of a control circuit of a transistor according to the present invention.

FIG. 2 represents a simplified diagram of a control device 1 of a transistor, referred to as a controlled transistor 3, according to the present invention. The control device 1 comprises the controlled transistor 3 which comprises three electrodes: a control electrode referenced $E_c$ and two other electrodes referenced $E_1$ and $E_2$. The controlled transistor 3 is, for example, an insulated gate bipolar transistor (IGBT) or a metal oxide semiconductor field effect transistor (MOSFET).

The control device 1 also comprises a main control circuit 5 connected to the control electrode $E_c$ of the controlled transistor 3 and configured to control the state of the controlled transistor 3 according to a main mode of operation. The main control circuit 5 in particular comprises a programmable logic component 7 configured to generate pulse-width modulation (PWM) signals configured to control the opening and closing of the controlled transistor 3 and a control member 9 (also called driver), configured to receive pulse-width modulation signals coming from the programmable logic component 7 and to transform them into control signals adapted to control the controlled transistor 3.

The control device 1 also comprises an auxiliary control circuit 11 configured to inject an auxiliary current opposing the current circulating between the main control circuit 5 and the control electrode $E_c$ of the controlled transistor 3 according to an auxiliary mode of operation. The passage from the main mode of operation to the auxiliary mode of operation being controlled by the main control circuit 5. This controlling will subsequently be defined in more detail in the description. The auxiliary control circuit 11 is also configured to detect the current circulating between the electrodes $E_1$ and $E_2$ of the controlled transistor 3 other than the control electrode $E_c$ and in particular to determine the value of the time drift of the current circulating between the electrodes $E_1$ and $E_2$ of the controlled transistor 3 other than the control electrode $E_c$. The auxiliary current is injected by the auxiliary control circuit 11 when a condition relating to the determined value of the time drift is verified. The value of the time drift of the current is, for example, determined by measuring the voltage at the terminals of an impedance 13 connected to an electrode $E_2$ of the controlled transistor 3 other than the control electrode $E_c$.

The control device 1 also comprises a control circuit 15 of the auxiliary control circuit 11, said control circuit 15 being configured to block or authorise the auxiliary operation of the auxiliary control circuit 11 depending on controls of the main control circuit 5.

Figure 3:
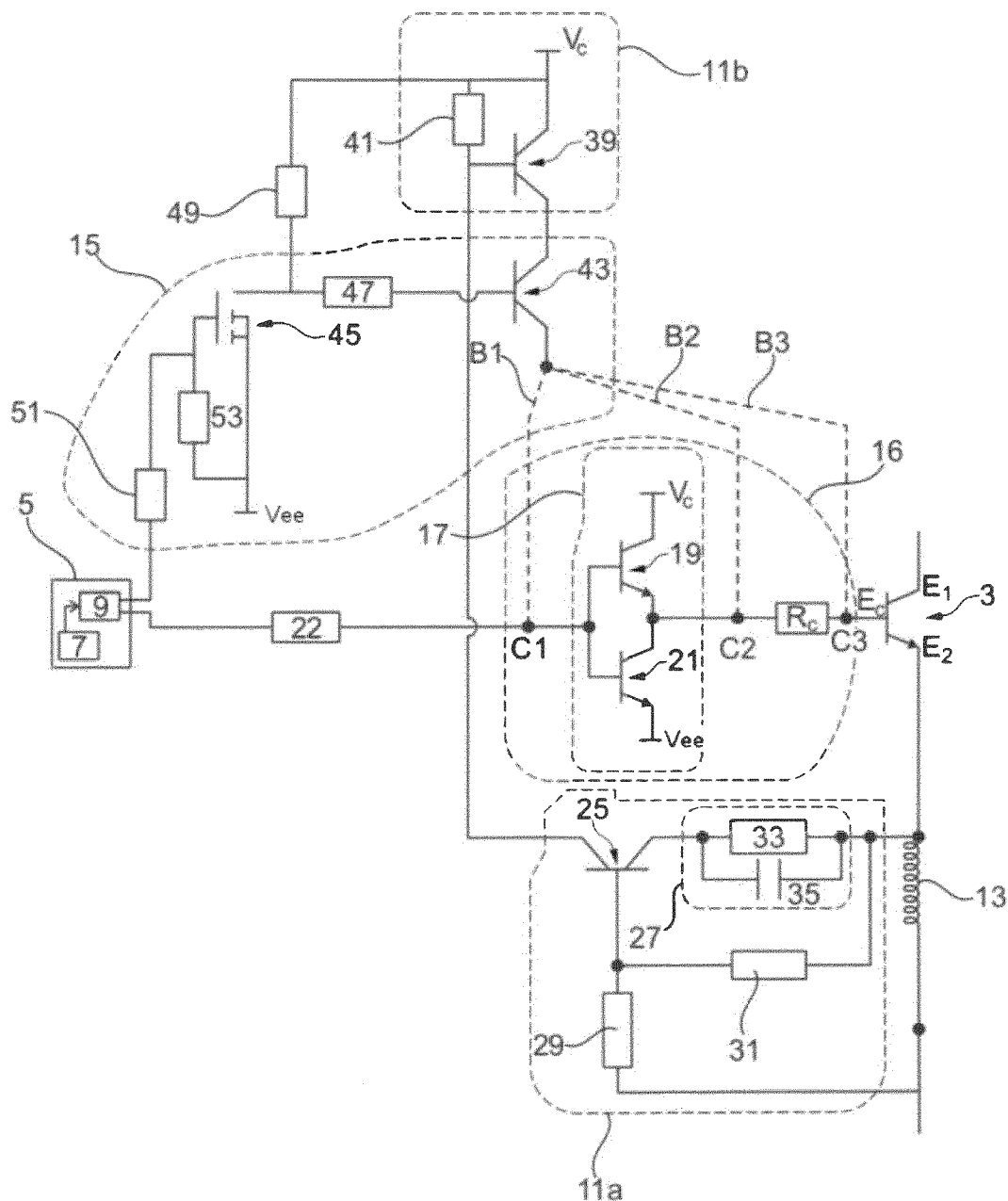
FIG. 3 represents a detailed diagram of a control circuit of a transistor according to the present invention.

The control device 1 will now be defined in more detail from FIG. 3.

Control elements 16 can be inserted between the main control circuit 5 and the control electrode $E_c$ of the controlled transistor 3. These control elements 16 comprise, for example, a push-pull type amplified 17. This amplifier 17 is produced by a first 19 and a second 21 transistor, of which the control electrodes are connected to each other and to the output of the main control circuit 5, for example via a resistor 22. The transistors 19 and 21 of the amplifier 17 are, for example bipolar-type transistors. The positive power electrode of the first transistor 19 is connected to a first voltage source referenced $V_c$. The negative power electrode of the first transistor 19 is connected, on the one hand, to the positive power electrode of the second transistor 21, and on the other hand, to the control electrode $E_c$ of the controlled transistor 3 via a resistor $R_c$, referred to as a control resistor. The negative power electrode of the second transistor 21 is connected to a second voltage source reference $V_{ee}$, the voltage level of the second voltage source $V_{ee}$ being less than the voltage level of the first voltage source $V_c$, the voltage $V_c$ is, for example, between 7 and 20V, in particular 15V and the voltage $V_{ee}$ is, for example, between 5 and 15V.

The control resistor $R_c$ also forms part of the control elements 16.

The auxiliary control circuit 11 comprises a detection member 11a configured to detect the voltage at the level of the impedance 13. The detection member 11a comprises a transistor 25 referred to as a detection transistor which is, for example, of bipolar type or of MOSFET type. The detection member 11a can also comprise an RC-type filter 27 and a voltage dividing bridge comprising a first 29 and a second 31 resistor to adapt the voltage detected at the terminals of the impedance 13 at the detection transistor 25. In this case, the first 29 and the second 31 resistors are arranged in series in a connection connected parallel with the impedance 13 and the control electrode of the detection transistor 25 is connected at the middle point of the connection between the first 29 and the second 31 resistors. A first electrode of the detection transistor 25 other than the control electrode is connected to a first terminal of the RC filter 27 comprising a resistor 33 in parallel with a condenser 35, the second terminal of the RC filter 27 being connected between the impedance 13 and the second electrode $E_2$ of the controlled transistor 3. The assembly comprising the impedance 13 and the dividing bridge at the terminals of the impedance 13, even the RC filter 27, therefore forms a current sensor for the control electrode of the detection transistor 25, said current sensor measuring the current circulating between the terminals E1 and E2 of the controlled transistor 3 other than the control electrode $E_c$.

The auxiliary control circuit 11 also comprises an injection member 11b configured to inject an auxiliary current between the main control circuit 5 and the control electrode $E_c$ of the controlled transistor 3. The injection member 11b comprises a transistor 39 referred to as an injection transistor, for example of bipolar or MOSFET type, of which the control electrode is connected, on the one hand, to the second electrode of the detection transistor 25 other than the control electrode and, on the other hand, to a voltage source, for example, the first voltage source $V_c$, via a resistor 41. A first electrode of the injection transistor 39 other than the control electrode is connected to said voltage source, for example, the first voltage source $V_c$. A second electrode of the injection transistor 39 is be connected between the main control circuit 5 and the controlled transistor 3, for example, to one of the terminals of one of the control elements 16. Thus, when the voltage value at the terminals of the impedance 13 (which is proportional to the time drift of the current crossing the electrodes $E_1$ and $E_2$ other than the control electrode $E_c$ of the controlled transistor 3) exceeds a predetermined threshold, the detection transistor 25 becomes looping, which makes the injection transistor 39 looping, such that a current is injected between the main control circuit 5 and the controlled transistor 3. This injected current leads to the passage to the loop state of the controlled transistor 3.

The auxiliary control circuit 11 therefore forms a feedback loop configured to enslave the value of the time drift of the current circulating between the electrodes $E_1$ and $E_2$ other than the control electrode $E_c$ of the controlled transistor 3 around a set value. This feedback loop therefore enables to reduce, even remove the surges at the level of the controlled transistor 3. Indeed, if, during the passage to the blocking state of the controlled transistor 3, the surge is too strong, the auxiliary control circuit 11 leads to the passage to the looping state of the controlled transistor 3 such that the passage from the looping state to the blocking state is done slower, which reduces, even removes the surges.

The control circuit 15 of the auxiliary control circuit 11 comprises a first switching element 43 arranged between the auxiliary control circuit 11 and the control elements 16 situated between the main control circuit 5 and the control electrode $E_c$ of the controlled transistor 3 to authorise or not the conducting of the injection member 39 and of the control electrode $E_c$, in particular via the control elements 16. The first switching element 43 referred to as a first switching transistor is, for example, produced by a bipolar- or MOSFET-type transistor. The first electrode of the first switching transistor 43 other than the control electrode is connected to the second electrode of the injection transistor 39 and the second electrode of the first switching transistor 43 other than the control electrode is connected to a connection point situated between the main control circuit 5 and the control electrode $E_c$ of the controlled transistor 3.

According to a first embodiment represented by the connection B1 (represented as a dotted line), the connection point is a first connection point C1 situated between the main control circuit 5 and the amplifier 17, in particular between the resistor 22 and the amplifier 17.

According to a second embodiment, alternative to the first embodiment, represented by the connection B2 (represented as a dotted line), the connection point C2 is situated between the amplifier 17 and the control resistor $R_c$.

According to a third embodiment, alternative to the first and to the second embodiment, represented by the connection B3 (represented as a dotted line), the connection point C3 is situated between the control resistor $R_c$ and the control electrode of the controlled transistor 3.

It must be noted, that the operation of the control device 1 is the same for the three embodiments.

The control electrode of the first switching transistor 43 is connected to a second switching element 45 via a resistor 47. The second switching element 45 referred to as a second switching transistor is, for example, produced by a MOSFET-type transistor with a channel N of which the drain is connected, on the one hand, to the control electrode of the first switching transistor 43 via the resistor 47 and, on the other hand, to the first electrode of the injection transistor 39 via a resistor 49. The gate of the second switching transistor 45 is connected, on the one hand, to a dedicated output of the control member 9 via a resistor 51 and to a voltage source, for example, the second voltage source $V_{ee}$, via a resistor 53. The source of the second switching transistor 45 is also connected to said voltage source, for example, the second voltage source $V_{ee}$. The dedicated output of the control member 9 corresponds to a separate output of the control output of the controlled transistor 3. The control signals connected to the dedicated output of the control circuit 15 of the auxiliary control circuit 11 will subsequently be defined in the description.

Thus, when a signal emitted by the dedicated output of the control member 9 makes the second switching transistor 45 looping, the voltage at the level of the control electrode of the first switching transistor 43 decreases, which makes the first switching transistor 43 blocking. The injection transistor 39 is thus no longer electrically conducted with one of the connection points C1, C2 or C3 such that the auxiliary control circuit 11 is inhibited and can no longer inject current at the level of the control electrode $E_c$ of the controlled transistor 3 and therefore can no longer make the controlled transistor 3 looping.

Figure 4:
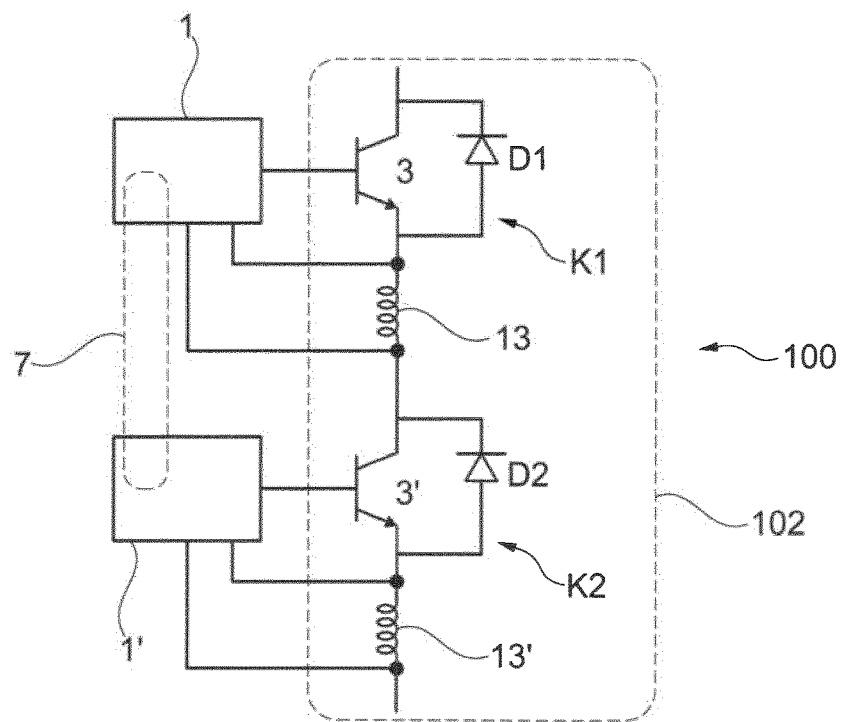
FIG. 4 represents a diagram of a control circuit according to an embodiment of the present invention.

FIG. 4 represents a control circuit 100 corresponding, for example, to a converter and comprising a connection 102 with a first K1 and a second K2 controlled element and a first 1 and a second 1' control circuit such as defined above and respectively connected to the first K1 and to the second K2 control element. A controlled element K1, K2 comprises a controlled transistor 3, 3' and a diode D1, D2 connected in anti-parallel to the controlled transistor 3, 3' as well as an impedance 13, 13'.

With such an architecture, the programmable logic component 7 of the main control circuit can be combined with the first 1 and the second 1' control circuits (other elements like the control member 9 can also be combined with the first 1 and the second 1' control circuits). Thus, the programmable logic component 7 generates pulse-width modulation signals to control the opening and the closing of the first 3 and of the second 3' controlled transistors.

Figure 5:
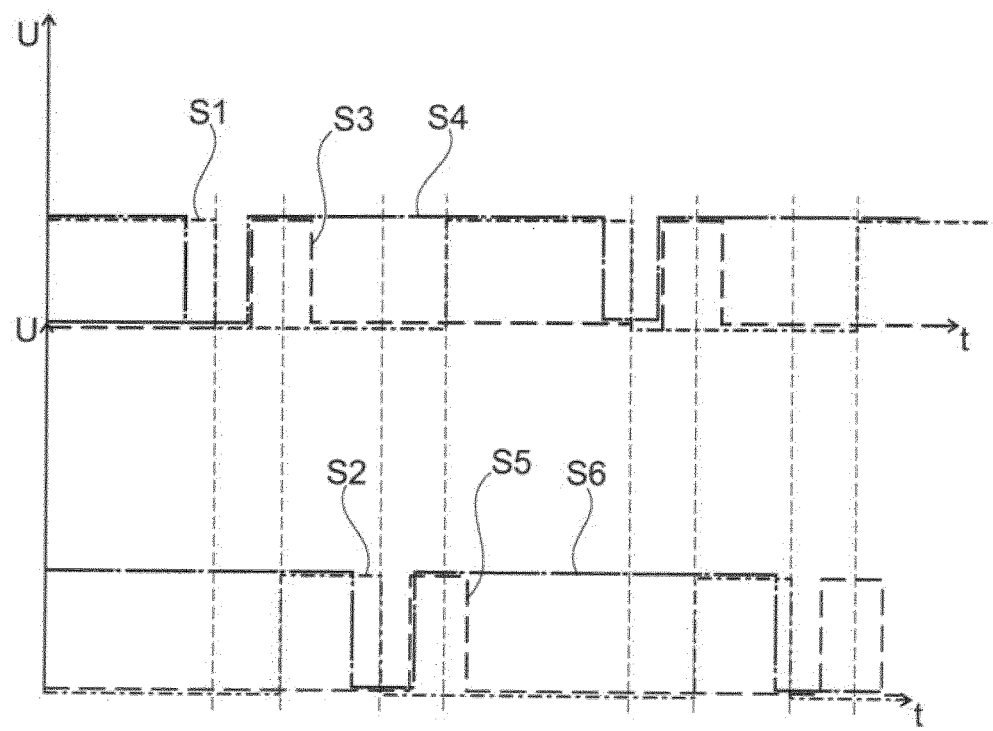
FIG. 5 represents a graph representing an example of control signals of a control circuit according to FIG. 4.

FIG. 5 represents a graphic example of the control signals S1 and S2 configured to respectively control the first 3 and the second 3' controlled transistors. The graph represents the voltage level U of the control signals sent to the control electrode $E_c$ for the first 3 and the second 3' transistor depending on the time t, the top part of the graph corresponding to the signals intended for the first control circuit 1 and the bottom part of the graph corresponding to the signals intended for the second control circuit 1'. It can be observed on the graph, that the two signals S1 and S2 are never at the top level simultaneously (to avoid a short-circuit in the connection).

To enable a strong operation of the control circuit 100, the control signal intended for the control circuit 15 connected to the first controlled transistor 3 must be at least low level during the falling edges of the signal S1, in other words, when the first controlled transistor 3 passes from a looping state to a blocking state, and must be at a high level during the rising edges of the signal S2, in other words, when the second controlled transistor 3' passes from a blocking state to a looping state.

The control signal intended for the control circuit 15 connected to the first controlled transistor 3 must therefore have a rising edge after the passage to the blocking state of the first controlled transistor 3 and before the passage of the second controlled transistor 3'.

The signal S3, respectively S4, therefore represents an example of a control signal intended for the control circuit 15 connected to the first controlled transistor 3 for which the duration at the top level is minimum, respectively maximum.

In the same way, the control signal intended for the control circuit 15 connected to the second controlled transistor 3' must be at the low level during falling edges of the signal S2, in other words, when the second controlled transistor 3' passes from a looping state to a blocking state, and must be at a high level during rising edges of the signal S1, in other words, when the first controlled transistor 3 passes from a blocking state to a looping state.

The control signal intended for the control circuit 15 connected to the second controlled transistor 3' must therefore have a rising edge after the passage to the blocking state of the second controlled transistor 3' and before the passage to the looping state of the first controlled transistor 3.

The signal S5, respectively S6, therefore represents an example of a control signal intended for the control circuit 15 connected to the second controlled transistor 3' for which the duration at the high level is minimum, respectively maximum.

Thus, the use of such control signals in a connection 102 of a converter 100 enable, on the one hand, to avoid surges during the passage from the looping state to the blocking state of a controlled transistor 3 because of the use of an auxiliary control circuit 11 which provides a feedback loop to the controlled transistor 3 and, on the other hand, to avoid a short-circuit in the connection 102 by inhibiting the action of the auxiliary control circuit 11 during the passage from the blocking state to the looping state of the other controlled transistor 3' of the connection 102. In addition, the elements of the control circuit 15 can easily be integrated with the elements of the main control circuit 5 and the auxiliary control circuit 11 such that the implementation of the present invention has no difficulty and has a reduced cost.

The invention claimed is:

1. A control device for controlling at least one transistor, referred to as a controlled transistor, comprising:
   said controlled transistor, the latter comprising a control electrode and two other electrodes,
   a main control circuit connected to the control electrode of the controlled transistor and configured to, according to a main mode of operation, control the state of the controlled transistor and,
   an auxiliary control circuit configured to, according to an auxiliary mode of operation, inject an auxiliary current opposing the current circulating between the main control circuit and the control electrode of the controlled transistor, wherein the control device also comprises a control circuit of the auxiliary control circuit, said control circuit being configured to block or authorise the auxiliary mode of operation of the auxiliary control circuit depending on the controls of the main control circuit.

2. The control device according to claim 1, wherein the control circuit is configured to electrically conduct the auxiliary control circuit and the control electrode of the controlled transistor to authorise the auxiliary mode of operation or to interrupt said electrical conduction and block the auxiliary mode of operation.

3. The control device according to claim 2, wherein the control circuit comprises a first switching element configured to enable the electrical conduction between auxiliary control circuit and the control electrode of the controlled transistor or to interrupt said electrical conduction.

4. The control device according to claim 3, wherein the control circuit comprises a second switching element corresponding to a MOSFET-type transistor with a channel N, of which:
the gate is connected to the main control circuit,
the drain is connected, on the one hand, to a first voltage source and, on the other hand, to the control electrode of the first switching element and,
the source is connected to a second voltage source, of which the voltage is less than the voltage of the first voltage source.

5. The control device according to claim 1, wherein the main control circuit comprises a programmable logic component configured to generate pulse-width modulation signals and a control member configured to receive pulse-width modulation signals coming from a logic component and to transform them into control signals of the controlled transistor.

6. The control device according to claim 1, wherein the auxiliary control circuit is configured to operate according to an auxiliary mode of operation when a predefined condition relating to the value of the time drift of the current circulating between the electrodes of the controlled transistor other than the control electrode is verified.

7. The control device according to claim 6, wherein the auxiliary control circuit is configured to enslave the value of the time drift of the current circulating between the transistor electrodes other than the control electrode around a set value.

8. The control device according to claim 1, wherein the auxiliary control circuit comprises a detection member and an injection member, said injection member being configured to inject an auxiliary current opposing the current circulating between the main control circuit and the control electrode of the controlled transistor when it receives a voltage coming from the detection member.

9. The control device according to claim 8, wherein the detection member comprises a transistor, referred to as a detection transistor, connected to a current sensor measuring the current circulating in the controlled transistor between the electrodes other than the control electrode, the current sensor comprising an impedance and a voltage dividing bridge, comprising a first and a second resistor, connected parallel from the impedance, the control electrode of the detection transistor is connected to the middle point of the voltage dividing bridge, the positive power electrode of the detection transistor is connected to a terminal of the impedance, in particular via an RC filter, and the negative power electrode of the detection transistor is connected to the injection member.

10. The control device (1) according to claim 9, wherein the injection member (11b) comprises a transistor (39), referred to as an injection transistor, of which the control electrode is connected to the detection member (11a) and to the first voltage source ($V_c$), via a resistor (41), the positive power electrode of the injection transistor (39) is connected to the first voltage source ($V_c$) and the negative voltage electrode is connected to the positive control electrode of the first switching element (43) of the control circuit (15).

11. The control device according to claim 8, wherein the injection member comprises a transistor, referred to as an injection transistor, of which the control electrode is connected to the detection member and to the first voltage source, via a resistor, the positive power electrode of the injection transistor is connected to the first voltage source and the negative voltage electrode is connected to the positive control electrode of the first switching element of the control circuit.

12. The control device according to claim 11, wherein the negative power electrode of the first switching element of the control circuit is connected to the control electrode of the controlled transistor.

13. The control device according to claim 11, wherein the negative power electrode of the first switching element of the control circuit is connected to the input of a power amplifier arrangement, in particular of "push-pull"-type, arranged between the main control circuit and the control electrode of the controlled transistor, the auxiliary control circuit being arranged such that this power amplifier arrangement is crossed by the injected current when the auxiliary mode of operation is applied.

14. The control device according to claim 11, wherein the negative power electrode of the first switching element of the control circuit is connected to a resistor, referred to as a control resistor, arranged between the main control circuit and the control electrode of the controlled transistor, at the level of the terminal of the control resistor which is not connected to the control electrode of the controlled transistor.

15. A control circuit of a connection comprising at least one first and a second controlled elements connected in series, a controlled element comprising a diode connected in anti-parallel with a controlled transistor, and at least one first and one second control device, according to claim 1, respectively connected to said first and second controlled elements, said first and second control devices being configured to put their respective connected controlled transistor in a looping state alternatively, or in a blocking state simultaneously.

16. The control circuit according to claim 15, wherein the first control device is configured to:
block the auxiliary operation of the auxiliary control circuit connected to the first controlled transistor when the second control device controls a passage to the looping state of the second controlled transistor,
authorise the auxiliary operation of the auxiliary control circuit connected to the first controlled transistor when said first control device controls a passage to the blocking state of the first controlled element,
and wherein the second control device is configured to:
block the auxiliary operation of the auxiliary control circuit connected to the second controlled transistor when the first control device controls a passage to the looping state of the first controlled transistor, authorise the auxiliary operation of the auxiliary control circuit connected to the second controlled transistor when said second control device controls a passage to the blocking state of the second controlled transistor.

17. An electrical converter comprising at least one connection (102) comprising a first (K1) and a second (K2) controlled element connected in series and at least one control circuit (100) according to claim 16.

18. An electrical converter comprising at least one connection comprising a first and a second controlled element connected in series and at least one control circuit according to claim 15.

* * * * *